United States Patent [19]
McQuilkin

[11] Patent Number: 6,121,798
[45] Date of Patent: Sep. 19, 2000

[54] HIGH-SPEED COMPARATOR WITH IMPROVED LATCH ACCURACY

[75] Inventor: Christopher McQuilkin, Salem, N.H.

[73] Assignee: Analog Devices, Inc., Norwood, Mass.

[21] Appl. No.: 09/167,128

[22] Filed: Oct. 5, 1998

[51] Int. Cl.[7] .................................................. H03F 3/45
[52] U.S. Cl. ............................................. 327/55; 327/57
[58] Field of Search ........................... 327/52–57, 65–70, 327/77–81, 87, 88, 89, 208

[56] References Cited

U.S. PATENT DOCUMENTS

| | | | |
|---|---|---|---|
| 4,237,387 | 12/1980 | Devendorf et al. | 327/223 |
| 4,274,017 | 6/1981 | Carter et al. | 327/198 |
| 4,855,617 | 8/1989 | Ovens | 327/217 |
| 4,963,772 | 10/1990 | Dike | 327/198 |
| 5,627,484 | 5/1997 | Tuminaro et al. | 327/56 |
| 5,910,736 | 6/1999 | Nagata et al. | 327/52 |
| 5,912,567 | 6/1999 | Drost et al. | 327/89 |
| 5,959,919 | 9/1999 | Choi | 327/52 |

OTHER PUBLICATIONS

Comparator # AM685, Advanced Micro Devices, Inc., 901 Thompson Place, Sunnyvale, CA 94088.

*Primary Examiner*—Tuan T. Lam
*Attorney, Agent, or Firm*—Koppel & Jacobs

[57] ABSTRACT

Comparator structures are shown which improve latching accuracy and enhance bandwidth for operations such as high-speed sampling in a variety of applications (e.g., analog-to-digital converters and automatic test equipment). The structures include an input differential pair of transistors having first and second control structures, a differential output amplifier and a clamp that limits the signal level of at least one of the first and second control structures. The clamp includes first and second Schottky diodes that are oppositely oriented and coupled between the first and second control structures. Alternatively one side of the diodes can be coupled to bias structures that respond to a threshold signal. Bias networks respond to a sampling threshold signal and stabilize biases in the input differential pair and the differential output amplifier. A differential input buffer preferably precedes the input differential pair and a diode bridge is positioned between these elements to limit current from the differential input buffer. To facilitate sampling, a latch maintains a current state of the differential output amplifier.

23 Claims, 3 Drawing Sheets

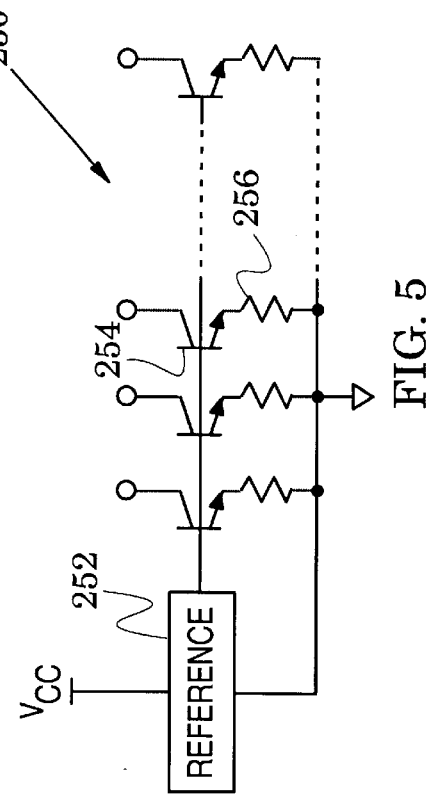
FIG. 4
FIG. 5
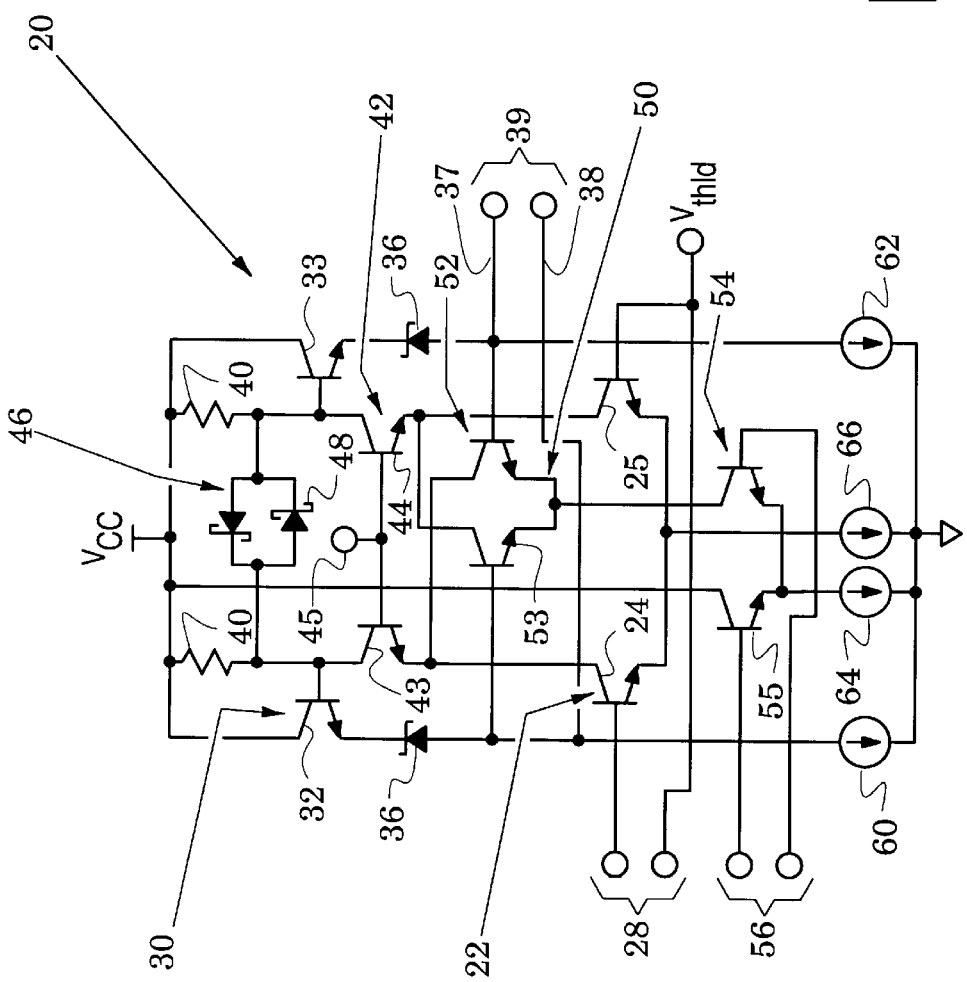
FIG. 1
(PRIOR ART)

HIGH-SPEED COMPARATOR WITH IMPROVED LATCH ACCURACY

BACKGROUND OF THE INVENTION

1. Field of the Invention

The present invention relates generally to electronic comparators and more particularly to latched comparators.

2. Description of the Related Art

FIG. 1 shows a latched comparator 20 that illustrates conventional concepts in the comparator art (e.g., it is similar to comparator AM685 that is available from Advanced Micro Devices, Inc., 901 Thompson Place, Sunnyvale, Calif.). It includes an input differential pair 22 of transistors 24 and 25 whose bases form an input signal port 28. The comparator also has an emitter-follower output buffer 30 of transistors 32 and 33 whose emitters are connected by zener diodes 36 to first and second output signal paths 37 and 38 that form an output signal port 39. Collectors of the emitter-follower output buffer 30 are connected to a supply source $V_{CC}$ and resistors 40 couple bases of the emitter-follower buffer 30 to the supply source $V_{CC}$.

A common-base output stage 42 of transistors 43 and 44 is coupled between the input differential pair 22 and the emitter-follower output buffer 30. Bases of the common-base output stage 42 are biased through a bias port 45 and a clamp 46 formed of oppositely-directed Schottky diodes 48 connects the bases of the emitter-follower output buffer 30.

A latch 50 is formed with a first latch differential pair 52 of transistors 53 and a second latch differential pair 54 of transistors 55. The first differential pair 52 has each of its bases connected to a respective one of the output signal paths 37 and 38 and each of its collectors connected to a respective one of collectors of the input differential pair 22. These bases and collectors are cross-coupled relative to each other, i.e., each of the transistors 53 has its base connected to one of the first and second output signal paths 37 and 38 and its collector connected to a side of the common-base output stage 42 that leads to the other of the first and second output signal paths 37 and 38.

The second latch differential pair 54 has one of its collectors supplying current to the first differential pair 52 (i.e., to the coupled emitters of this differential pair) and the other of its collectors is connected to the supply source $V_{CC}$. Bases of the differential pair 54 form a latch signal port 56.

Essentially, each transistor of the first latch differential pair 52 holds the current state of a respective transistor of the input differential pair 22 during the presence of a latch signal.

The zener diodes 36, the emitters of the second latch differential pair 54 and the emitters of the input differential pair 22 are respectively biased on via current sources 60, 62, 64 and 66.

In many comparator applications, a signal at one signal path of the input port 28 is compared to a threshold voltage $V_{thld}$ that is applied at the other input signal path as indicated in broken lines in FIG. 1. In absence of the latch 50, an output signal at the comparator's output port 39 will then indicate the relationship between the input signal and the threshold voltage $V_{thld}$. When a latch signal is applied to the latch port 56, the output signal at port 39 represents the relationship between the input signal and the threshold voltage $V_{thld}$ at times specified by the latch signal. In this mode, the comparator is often referred to as a sampler because it "samples" the input signal at times defined by the latch signal.

Although suitable for general operation, several structural portions of the comparator 20 limit its application at higher speeds. To enhance high-speed operation, it is critical that a comparator's propagation delay be substantially insensitive to input signal conditions (e.g., rise time, slew rate, overdrive, signal polarity, duty cycle and common-mode signals). In contrast, propagation delays in the comparator 20 are sensitive to all of these parameters.

Because of the comparator's structure, for example, differential heating in the input differential pair 22 is a function of signal duty cycle and this heating will affect signal propagation delay. If the base of transistor 24 is above that of transistor 25, transistor 24 carries a greater current and dissipates a greater power. The resultant unequal heating in the input differential pair 22 induces a differential change in base-emitter voltage (on the order of 2 mV/degree Centigrade) which acts as a time-dependent input-signal offset that converts into a propagation delay change.

This susceptibility to thermal heating is also caused, in part, because the common-base output stage 42 must be biased (via the bias port 45) close to $V_{CC}$ to accommodate the positive portion of the input's common-mode signal range. Accordingly, the input differential pair 22 has large collector-to-emitter voltages and large power differentials. In addition, the collector-to-emitter voltages of transistors 24 and 25 are a function of common mode which induces further differential heating and consequent changes in propagation delay. Propagation delays in the comparator 20, therefore, have an undesirable sensitivity to common-mode signals.

Propagation delays are also sensitive to input signal swing and signal rise time. A parasitic capacitance (due to comparator structures such a signal traces) will exist at the emitters of the input differential pair 22. In the comparator 20, the input differential pair must track the full extent of the input-signal range and, accordingly, propagation delays caused by charging of the parasitic capacitance will be greater for a small, slow input signal swing than for a fast, large signal change. For a small, slow change, the parasitic capacitance represents a light load to the input differential pair 22. In contrast, it represents a large load for fast, large changes. Because the input differential pair 22 tracks the entire input-signal range, its sensitivity to signal swing and rise time is therefore increased.

The comparator 20 is also limited in its input differential-signal range and in its bandwidth. The first limitation results because the input signal range cannot exceed the base-to-emitter breakdown voltage of the transistors 24 and 25 which is typically on the order of a couple of volts. The second limitation results because the comparator 20 requires the Schottky diodes 48 to limit signal swings at the collectors of transistors 43 and 44 so as to prevent their saturation. However, these diodes compromise the comparator's bandwidth.

SUMMARY OF THE INVENTION

The present invention is directed to comparators whose structures (e.g., stabilized semiconductor biasing) enhance latching accuracy and thus make them suitable for high-speed sampling (e.g., on the order of 2 GHz) in a variety of applications (e.g., analog-to-digital converters and automatic test equipment).

These goals are realized with an input differential pair of transistors having first and second control structures (i.e., bases or gates), a differential output amplifier and a clamp that limits the signal level of at least one of the first and second control structures.

In a comparator embodiment, the clamp includes first and second diodes that are oppositely oriented and coupled between the first and second control structures. In another embodiment, first and second bias structures generate first and second bias signals in response to a sampling threshold signal and the clamp includes first and second diodes that are oppositely oriented and that are coupled to the first control structure and also coupled to receive the first and second bias signals.

In other comparator embodiments, bias networks respond to the threshold signal and stabilize biases (e.g., collector-to-emitter voltage) in the input differential pair and the differential output amplifier. An input buffer preferably precedes the input differential pair and a diode bridge is positioned between these elements to limit current from the input buffer.

To facilitate sampling, comparators of the invention preferably include a latch that receives a latch signal and, in response, maintains a current state of the differential output amplifier. In a comparator embodiment, the latch has first and second differential pairs of transistors. The first latch differential pair holds current states of the input differential pair. The second latch differential pair of transistors has first and second control structures coupled to receive a latch signal and first and second current structures coupled to respectively supply current to the input differential pair and the first latch differential pair.

The novel features of the invention are set forth with particularity in the appended claims. The invention will be best understood from the following description when read in conjunction with the accompanying drawings.

BRIEF DESCRIPTION OF THE DRAWINGS

FIG. 1 is a schematic diagram of an exemplary conventional comparator;

FIG. 4 illustrates an exemplary circuit substitution in the comparators of FIGS. 2 and 3; and FIG. 5 illustrates an exemplary current source in the comparators of FIGS. 2 and 3.

DETAILED DESCRIPTION OF THE PREFERRED EMBODIMENTS

Figure 2:
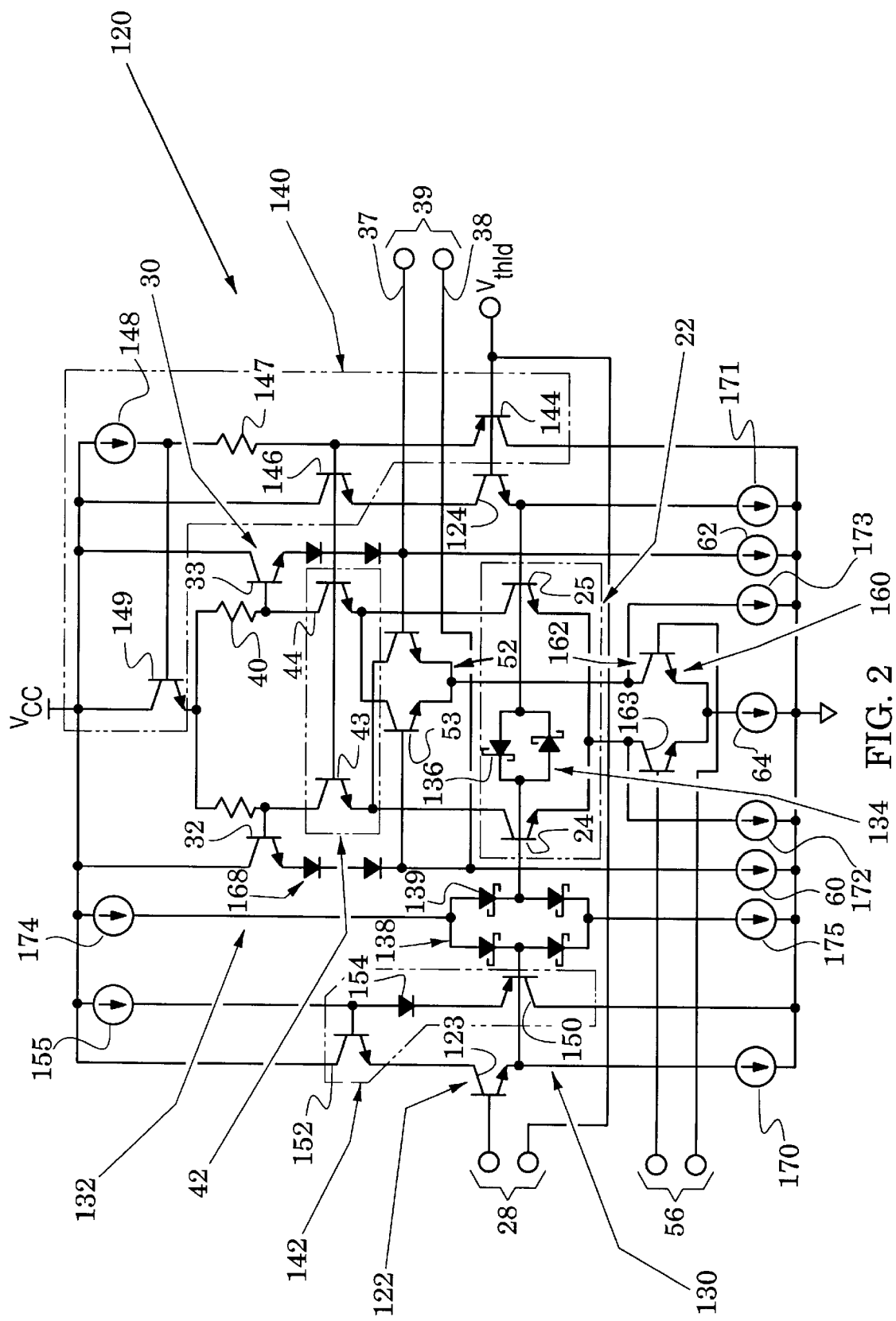
FIG. 2 is a schematic diagram of a comparator embodiment of the present invention.

FIG. 2 illustrates a latched comparator 120 of the present invention. The comparator 120 includes clamp, bridge, latch and bias networks that improve its propagation-delay stability and increase its bandwidth. Although a differential input voltage can be applied at the input signal port 28 of the comparator 120, the comparator is preferably operated by establishing a threshold voltage $V_{thld}$ on one signal path of the input port (as shown in broken lines in FIG. 2) for comparison with an input signal that is applied at the other signal path.

The comparator 120 includes selected elements of the comparator 20 of FIG. 1 and, accordingly, those like elements are indicated by like reference numbers. In contrast to the comparator 20, however, the comparator 120 precedes the input differential pair 22 with an emitter-follower input buffer 122 having transistors 123 and 124. The emitter-follower input buffer 122 and input differential pair 22 thus form an input differential amplifier 130 which couples to an output differential amplifier 132 that is formed by a combination of the common-base output stage 42 and the emitter-follower output buffer 30.

In an important feature of the invention, the comparator 120 positions a clamp 134 across the transistor bases of the input differential pair 22. The clamp 134 is formed with oppositely-oriented Schottky diodes 136. In another feature, the comparator 120 forms a bridge 138 of Schottky diodes 139 and inserts it between transistors 123 and 24 of the emitter-follower input buffer 122 and the input differential pair 22.

The comparator 120 also provides first and second biasing networks 140 and 142. The network 140 is responsive to the base of the emitter-follower transistor 124 (i.e., responsive to the threshold voltage $V_{thld}$) and stabilizes biases of the emitter-follower transistor 124, the input differential pair transistor 25 and the common-base output stage 42. Because saturation in the common-base output stage 42 is no longer possible, the clamp 46 of FIG. 1 (and its bandwidth limitations) has been eliminated.

In particular, the network 140 has a first bias transistor 144 whose emitter is joined to the base of a second bias transistor 146 and a bias resistor 147 couples these joined structures through a current source 148 to the supply source $V_{CC}$. The base of bias transistor 144 is connected to the base of the emitter-follower input transistor 124 and the base of bias transistor 146 is connected to the bases of the common-base output stage 42. A third bias transistor 149 is coupled between the supply source $V_{CC}$ and the resistors 40 with its base connected to the junction between current source 148 and the bias resistor 147.

Offsetting diode drops in bias transistors 144 and 146 establish the collector-to-base bias of the emitter-follower transistor 124 to be substantially zero. An additional diode drop through the common-base transistor 44 establishes the collector-to-base bias of the differential pair transistor 25 to be substantially a single diode drop. The emitter of transistor 43 has the same potential as the emitter of transistor 44.

A constant voltage drop is generated across the resistor 147 because of the current source 148 and this constant voltage drop combined with a diode drop through bias transistor 149 causes the voltage at the top of resistors 40 to have a constant offset from the threshold voltage $V_{thld}$. Accordingly, the collector-to-base voltages in the common-base output stage 42 are substantially constant.

The biasing network 142 is responsive to the base voltage of the differential pair transistor 24 and stabilizes biases of the emitter-follower input transistor 123.

In particular, the network 142 has first and second bias transistors 150 and 152 with a bias diode 154 coupling the base of transistor 152 and the emitter of transistor 150. A junction between the bias transistor 152 and the bias diode 154 is coupled through a current source 155 to the supply source $V_{CC}$. The base of bias transistor 150 and the emitter of bias transistor 152 are respectively connected to the base and collector of emitter-follower input transistor 123. Diode drops through transistors 150 and 152 and diode 154 thus restrict the collector-to-emitter voltage of the emitter-follower transistor 123 to be substantially a single diode drop.

In the comparator 120, the latch 50 of FIG. 1 is replaced by a latch 160 that responds to a latch signal at the latch port 56 and maintains a current state at the output port 39. It includes the first latch differential pair 52 of FIG. 1 and a second latch differential pair 162 of transistors 163. In contrast to the second latch differential pair 54 of FIG. 1, the second latch differential pair 162 is arranged to selectively supply current to the input differential pair 22 and the first latch differential pair 52. Accordingly, the current source 64 of FIG. 1 is retained but the current source 66 is discarded.

In association with the emitter-follower output buffer 30, a serially-connected diode pair 168 replaces each of the zener diodes 34 of FIG. 1. Current sources 170 and 171 are respectively connected to the emitters of emitter-follower input transistors 123 and 124, current sources 172 and 173 are connected to opposite collectors of the second latch differential pair 162 and current sources 174 and 175 are connected to upper and lower sides of the bridge 138. The current sources 172 and 173 are configured to supply a small bias current.

As previously mentioned, latching accuracy is degraded if differential elements in a comparator's signal path are subjected to differential heating. Because different semiconductor bias levels will cause differential heating, latching accuracy is therefore degraded when semiconductor bias conditions (e.g., collector-to-base voltages) are allowed to change in response to differential-mode and/or common-mode signals. This degradation is emphasized when the comparator's input signal has an asymmetric duty cycle (i.e., a duty cycle that significantly differs from 50%) which exploits the lack of biasing stability.

Accordingly, the performance of the comparator 120 of FIG. 2 is substantially enhanced because its structure effectively stabilizes semiconductor biasing and reduces its dependance on differential-mode and/or common-mode signals.

As a first example of this bias stabilization, the bias network 140 stabilizes the collector-to-base biases of the common-base output stage 42, the input differential pair transistor 25 and the emitter-follower input transistor 124. Although the collector-to-base bias of the common-base output stage 42 will have two values that correspond to high and low values of the comparator's input signal, these values will be not be a function of differential-mode and/or common-mode signals.

The bias network 140 realizes this stabilization because it is responsive to the threshold voltage $V_{thld}$ and maintains semiconductor biases in a fixed relationship with this voltage. The bias network 142 supplements the bias network 140 by stabilizing the collector-to-base bias of the other emitter-follower input transistor 123.

In another bias stabilization example, the clamp 134 restricts the base of the other input differential pair transistor 24 within a bias window that is centered about the stabilized base voltage of the input differential pair transistor 25. The voltage drops of the opposed Schottky diodes 136 define this bias window so that it is on the order of 1.5 volts. The clamp 134 thus reduces differential heating in the input differential pair 134.

Because the clamp 134 restricts differential-mode signal excursion at the base of transistor 24 to a small bias window, it also stabilizes a charging time required for charging (and discharging) of a stray capacitance formed by circuit structures (e.g., integrated-circuit traces) associated with the emitters of the input differential pair 22. In the conventional comparator 20 of FIG. 1, this charging time is a function of the differential-mode signal so that propagation delay through the comparator is also a function of the differential-mode signal. This functional relationship is substantially reduced in the comparator 120 of FIG. 2.

In contrast to the comparator 20, the comparator 120 positions the clamp 134 at a low-impedance circuit point (output of the emitter-followers 123 and 124 of the input buffer 122) so that the bandwidth limitations of the clamp's capacitance are significantly reduced.

Because it restricts travel of the base of input differential pair transistor 24, the clamp 134 causes currents in the emitter-follower input transistor 123 to be a function of input differential-mode signals. Accordingly, the comparator 120 includes the bridge 138 which does not alter the differential-mode signal throughout the clamp's bias window but does limit the current of the emitter-follower input transistor 123 when the differential-mode signal is out of the bias window.

The current of current sources 174 and 175 divides symmetrically between sides of the bridge when the differential-mode signal is within the clamp's bias window and divides asymmetrically when it is not. The asymmetry essentially absorbs and limits output current from the emitter-follower input transistor 123.

The second latch differential pair 162 of transistors 163 switches the current of current source 64 between the input differential pair 22 and the first latch differential pair 52 so that currents and, hence, biases in the common-base output stage 42 are substantially constant. In contrast, the latch 50 of the comparator 20 of FIG. 1 was arranged to change currents and biases in the common-base output stage 42 at the latch's repetition rate.

When the second latch differential pair 162 switches current of current source 64 away from the input differential pair 22 and the first latch differential pair 52, the potential of their emitters is undefined which reduces bias stabilization in the comparator. Accordingly, current sources 172 and 173 provide small bias currents which are sufficient to establish emitter potentials while not disturbing latching operations.

Action of the bias network 140 causes the emitter potentials of the common-base output stage 42 to substantially equal the threshold voltage $V_{thld}$. If the voltage drop through the resistor 147 is on the order of three diode drops, the bias network 140 (and, in particular, the diode pair 168) will set the base potentials of the first latch differential pair 52 to also substantially equal the threshold voltage $V_{thld}$ when no current flows through the resistors 40 and to a lower potential otherwise. Therefore, the transistors of the first latch differential pair 52 are never allowed to saturate so that the comparator's operational speed is enhanced.

Figure 3:
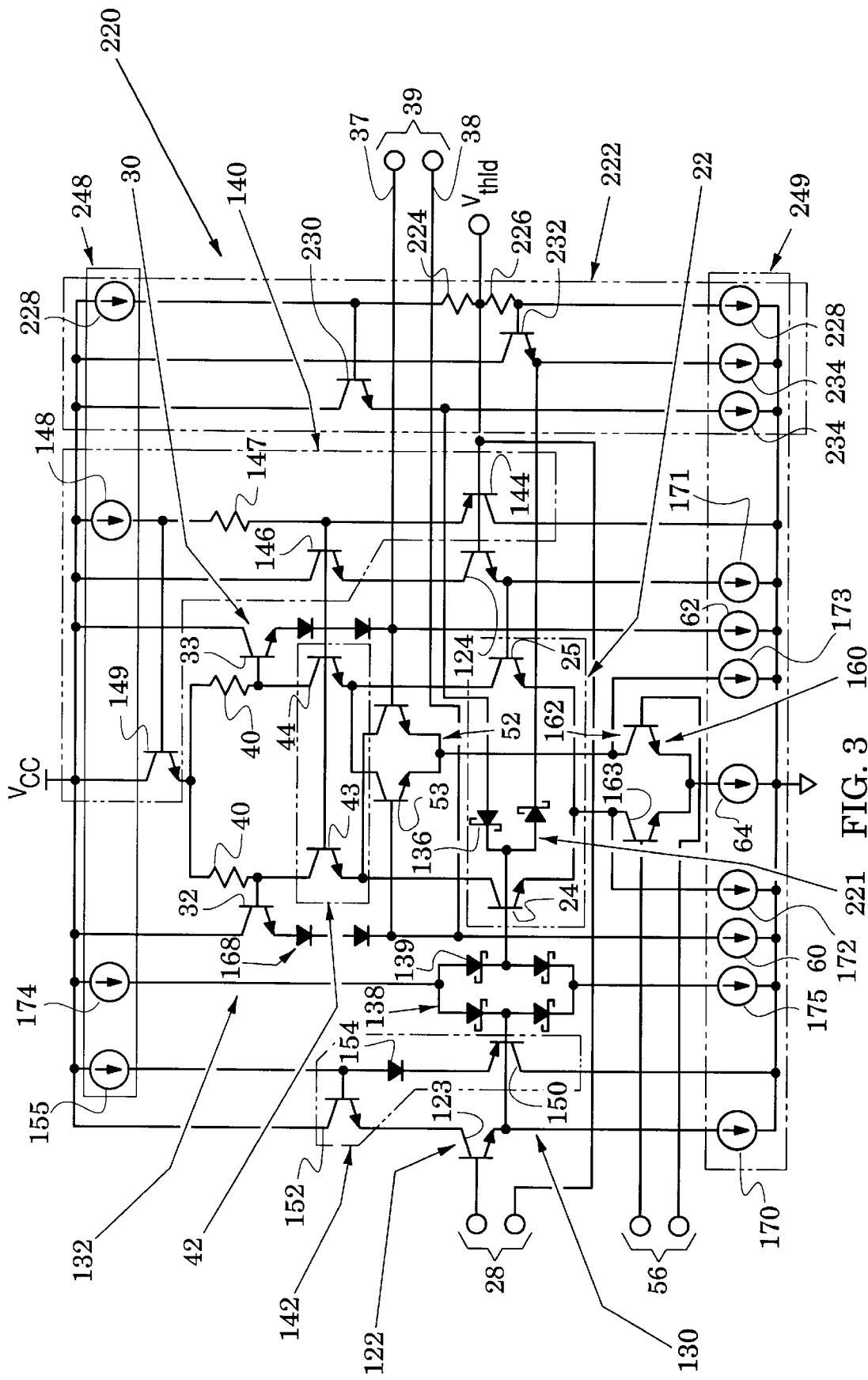
FIG. 3 is a schematic diagram of another comparator embodiment.

It was stated above that the clamp 134 of FIG. 2 restricts the base of the input differential pair transistor 24 within a bias window that is on the order of 1.5 volts, i.e., a window established by the diode drops of the Schottky diodes 136. The comparator 220 of FIG. 3 illustrates bias structure that further reduces the width of this bias window.

The comparator 220 includes most of the structure of the comparator 120 with like elements indicated by like reference numbers. The clamp 134, however, is rearranged into a clamp 221 that is connected at one end to the base of the input differential pair transistor 24 so as to stabilize this base's bias. The other end of the clamp 221 is connected to a bias network 222 that includes resistors 224 and 226 that are serially connected through a pair of current sources 228.

The fixed current flow through the resistors 224 and 226 generates a pair of bias voltages at opposite ends of these resistors that are fixed relative to the threshold voltage $V_{thld}$. First and second emitter-follower transistors 230 and 232 are connected to carry the currents of current sources 234 and to receive the bias voltages associated with the resistors 224 and 226. Comparator 220 therefore permits the bias window coupled to the base of input differential pair transistor 24 to be reduced (e.g., to substantially zero) from its value in the comparator 120 of FIG. 1.

In addition to improving latch accuracy, the bias stabilization of the comparators of the invention also reduces overall semiconductor heating and thus permits the use of smaller transistors which, in turn, enhances other comparator parameters, e.g., bandwidth. Although the advantages of these comparators has been described with reference to their latching mode of operation, the same advantages are realized in a comparator mode, i.e., when a differential signal is applied at the input port 28 of FIGS. 2 and 3.

Comparators of the invention are especially suited for integrated circuit fabrication and circuit elements can be modified or substituted accordingly. In an exemplary integrated circuit realization, for example, the resistors 40 of FIG. 2 (and their associated voltage drop) may be effectively replaced by a string of diodes such as the three diode string 240 of FIG. 4. The replacement is indicated by replacement arrow 242. As previously described, a three diode drop in potential will restrict the base potentials of the first latch differential pair 52 in FIGS. 2 and 3 so that they never exceed the potentials of the pair's collectors.

In practicing the teachings of the invention, well known generic circuit elements can be realized with various specific circuits of the comparator art. For example, the comparator 220 of FIG. 3 includes current sources that are grouped into current source circuits 248 and 249. An exemplary realization of these circuits is the current source system 250 of FIG. 5 which has a voltage reference 252, a plurality of transistors 254 and a plurality of resistors 256 that are each connected to the emitter of a respective one of the transistors.

The reference can be any of various ones of the comparator art (e.g., a band-gap reference or a $V_t$-based reference). The transistors 254 and their respective resistors are connected across the reference 252 and their collectors are available as current sources that each carry a current equal to the voltage of the reference (less the base-emitter drop of the transistors) divided by the resistance of the resistors 256.

Although portions of the comparators 120 and 220 of FIGS. 2 and 3 have been termed differential input and output amplifiers 130 and 132, these terms do not necessarily imply positive gain as amplifier gain may, in general, be negative, zero or positive.

The invention has been illustrated with a specific type of transistor (bipolar) having current structures (emitter and collector) that respond to a control structure (base). However, the teachings of the invention may be practiced with other types of transistors (e.g., metal-oxide field-effect) having other current structures (e.g., drain and source) that respond to a control structure (e.g., gate).

The preferred embodiments of the invention described herein are exemplary and numerous modifications, dimensional variations and rearrangements can be readily envisioned to achieve substantially equivalent results, all of which are intended to be embraced within the scope of the appended claims.

I claim:

1. A comparator having an input signal port and an output signal port and responsive to an input signal at said input signal port and to a latch signal, comprising:

a differential input amplifier which includes an input differential pair of transistors having first and second control structures that form said input signal port;

a differential output amplifier that forms said output signal port and is responsive to said input differential pair of transistors;

a clamp that is coupled between said first and second control structures to limit the amplitude of said input signal between said input differential pair of transistors; and a latch which receives said latch signal and, in response, maintains a current state of said differential output amplifier;

wherein said clamp includes first and second diodes that are oppositely oriented and coupled between said first and second control structures.

2. The comparator of claim 1, wherein said transistors are bipolar transistors and said first and second control structures are first and second bases.

3. The comparator of claim 1, wherein said first and second diodes are Schottky diodes.

4. The comparator of claim 1, wherein said differential output amplifier includes a common-base output stage.

5. The comparator of claim 4, wherein said differential output amplifier further includes an output buffer that is inserted between said common-base output stage and said output port.

6. The comparator of claim 5, further including a bias network that responds to said input signal and establishes a bias across at least one of the transistors of said input differential pair.

7. The comparator of claim 1, wherein said input differential pair has first and second current structures and said output signal port defines first and second signal paths that are respectively responsive to the input differential pair's first and second current structures and said latch includes:

a) a first latch differential pair of transistors having first and second control structures respectively coupled to said first and second signal paths and having first and second current structures respectively coupled to the input differential pair's second and first current structures; and b) a second latch differential pair of transistors having first and second control structures coupled to receive said latch signal and first and second current structures coupled to respectively supply current to said input differential pair of transistors and said first latch differential pair.

8. The comparator of claim 7, wherein the transistors of said input differential pair and said first and second latch differential pairs are bipolar transistors, said first and second control structures are bases and said first and second current structures are collectors.

9. A comparator having an input signal port and an output signal port and responsive to an input signal at said input signal port and to a latch signal, comprising:

a differential input amplifier which includes an input differential pair of transistors having first and second control structures that form said input signal port;

a differential output amplifier that forms said output signal port and is responsive to said input differential pair of transistors;

a clamp that is coupled between said first and second control structures to limit the amplitude of said input signal between said input differential pair of transistors; and a latch which receives said latch signal and, in response, maintains a current state of said differential output amplifier;

and further including a bias structure that generates first and second bias signals and wherein said clamp includes first and second diodes that are oppositely oriented and that are coupled to said first control structure and also coupled to receive said first and second bias signals.

10. The comparator of claim 9, wherein said differential input amplifier further includes an input buffer that is inserted between said input signal port and said input differential pair.

11. A comparator having an input signal port and an output signal port and responsive to an input signal at said input signal port and to a latch signal, comprising:
   a differential input amplifier which includes an input differential pair of transistors having first and second control structures that form an input port;
   a differential output amplifier that forms an output port and is responsive to said input differential pair of transistors;
   a clamp that is coupled between said first and second control structures to limit the amplitude of said input signal between said input differential pair of transistors; and
   a latch which receives said latch signal and, in response, maintains a current state of said differential output amplifier;
   wherein said differential input amplifier further includes an input buffer that is inserted between said input port and said input differential pair of transistors;
   and further including a diode bridge inserted between one side of said input buffer and said input differential pair of transistors to limit currents of said input buffer.

12. The comparator of claim 11, wherein the diodes of said diode bridge are Schottky diodes.

13. A comparator having an input signal port and an output signal port and responsive to a latch signal, comprising:
   an input buffer formed by first and second transistors with first and second control structures that define said input signal port;
   an input differential pair of of third and fourth transistors that is responsive to said input buffer;
   a differential output amplifier coupled between said input differential pair and said output signal port;
   a first biasing network that responds to one of said first and second control structures and generates a first bias signal that is coupled through said differential output amplifier to said fourth transistor of said differential pair;
   a second biasing network that is responsive to said third transistor of said input differential pair and generates a second bias signal that is coupled to one of said first and second transistors; and
   a latch which receives said latch signal and, in response, maintains a current state of said differential output amplifier.

14. The comparator of claim 13, wherein said transistors are bipolar transistors and said first and second control structures are first and second bases.

15. The comparator of claim 13, wherein;
   said differential output amplifier includes a common-base output stage;
   said first biasing network includes:
      a) a first bias transistor coupled between one of said first and second control structures and the bases of said common-base output stage; and
      b) a second bias transistor coupled between the bases of said common-base output stage and one transistor of said input differential pair; and
   said second biasing network includes:
      a) a third bias transistor coupled to another transistor of said input differential pair; and
      b) a diode and a fourth bias transistor serially coupled between said third bias transistor and one of said first and second transistors.

16. The comparator of claim 15, wherein said differential output amplifier further includes an output buffer that is inserted between said common-base output stage and said output port.

17. The comparator of claim 13, further including:
   a clamp that couples said third and fourth transistors of said input differential pair; and
   a diode bridge inserted between one side of said input buffer and said input differential pair to limit currents of said input buffer.

18. A comparator having an input signal port and an output signal port and responsive to a latch signal, comprising:
   a differential input amplifier which includes an input differential pair of transistors having first and second control structures that form said input signal port;
   a differential output amplifier that is coupled to said input differential pair and said output signal port;
   a clamp coupled to limit an input signal level on at least one of said first and second control structures; and
   a latch which receives said latch signal and, in response, maintains a current state of said differential output amplifier;
   wherein said latch includes:
      a) a first latch differential pair of transistors that each have a current structure and a control structure cross-coupled across said output signal port; and
      b) a second latch differential pair arranged to switch a current between said input differential pair and said first latch differential pair in response to said latch signal.

19. The comparator of claim 18, wherein said clamp includes first and second diodes that are oppositely oriented and coupled between said first and second control structures.

20. The comparator of claim 18, further including first and second current sources respectively coupled to said input differential pair and said first latch differential pair to define current-structure potentials.

21. The comparator of claim 18, wherein said transistors are bipolar transistors and said first and second input structures are first and second bases.

22. The comparator of claim 18, wherein said differential input amplifier further includes an input buffer that is inserted between said input differential pair and said input port.

23. The comparator of claim 22, further including a diode bridge inserted between one side of said input buffer and said input differential pair to limit currents of said input buffer.

* * * * *